US009689904B2

(12) United States Patent
Peczalski et al.

(10) Patent No.: US 9,689,904 B2
(45) Date of Patent: Jun. 27, 2017

(54) CURRENT SENSOR WITH STRAY MAGNETIC FIELD REJECTION

(71) Applicant: Honeywell International Inc., Morristown, NJ (US)

(72) Inventors: Andy M. Peczalski, Edina, MN (US); Kyle Vinnedge, Forreston, IL (US)

(73) Assignee: Honeywell International Inc., Morris Plains, NJ (US)

( * ) Notice: Subject to any disclaimer, the term of this patent is extended or adjusted under 35 U.S.C. 154(b) by 141 days.

(21) Appl. No.: 14/702,975

(22) Filed: May 4, 2015

(65) Prior Publication Data
US 2016/0327594 A1     Nov. 10, 2016

(51) Int. Cl.
  *G01R 33/00*   (2006.01)
  *G01R 15/20*   (2006.01)

(52) U.S. Cl.
  CPC ................. *G01R 15/207* (2013.01)

(58) Field of Classification Search
  USPC .................... 324/117 R, 126, 244
  See application file for complete search history.

(56) References Cited

U.S. PATENT DOCUMENTS

| | | | |
|---|---|---|---|
| 2014/0103918 A1* | 4/2014 | Nomura ............ | G01R 19/0092 324/244 |
| 2014/0184212 A1* | 7/2014 | Yamaguchi .......... | G01R 15/207 324/244 |
| 2014/0225593 A1* | 8/2014 | Nakajima .............. | G01R 15/20 324/117 R |
| 2015/0015241 A1* | 1/2015 | Tamura ............... | G01R 33/091 324/117 R |

* cited by examiner

*Primary Examiner* — Vincent Q Nguyen
(74) *Attorney, Agent, or Firm* — Conley Rose, P.C.; Kristin Jordan Harkins

(57) ABSTRACT

An electrical bus bar system (10) is provided for mounting a plurality of current sensor devices (12) in close proximity to each other, each of the current sensor devices (12) having a sense axis (14). The system includes a plurality of elongate bus bars (16) extending along longitudinal axes (18) parallel to each other. The bus bars (16) are spaced from each other along a transverse axis (20) that extends perpendicular to the longitudinal axes (18). Each bus bar has a current sensor mount portion (22) configured to mount one of the current sensor devices (12) with the sense axis (14) extending parallel to the transverse axis (20).

20 Claims, 4 Drawing Sheets

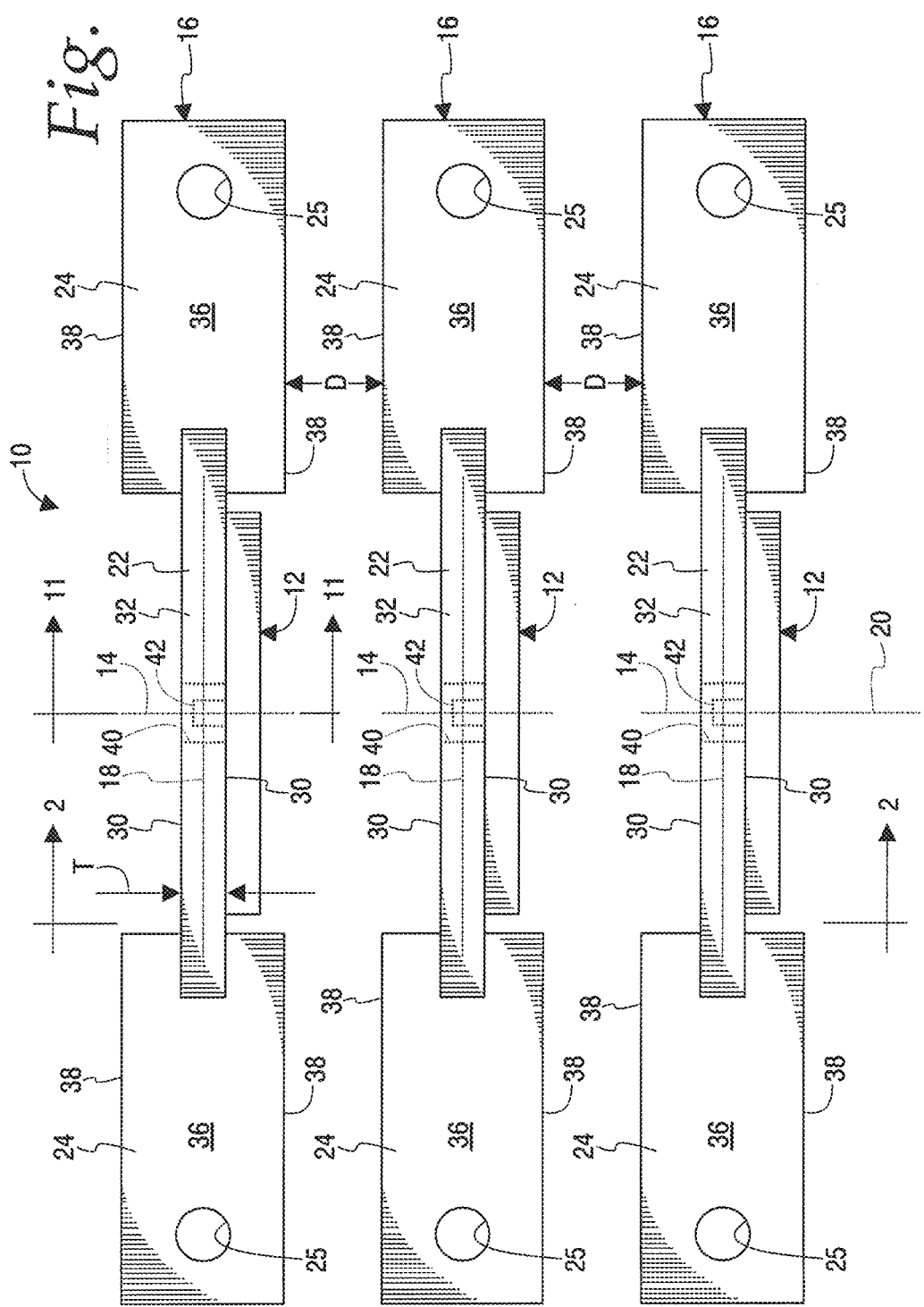

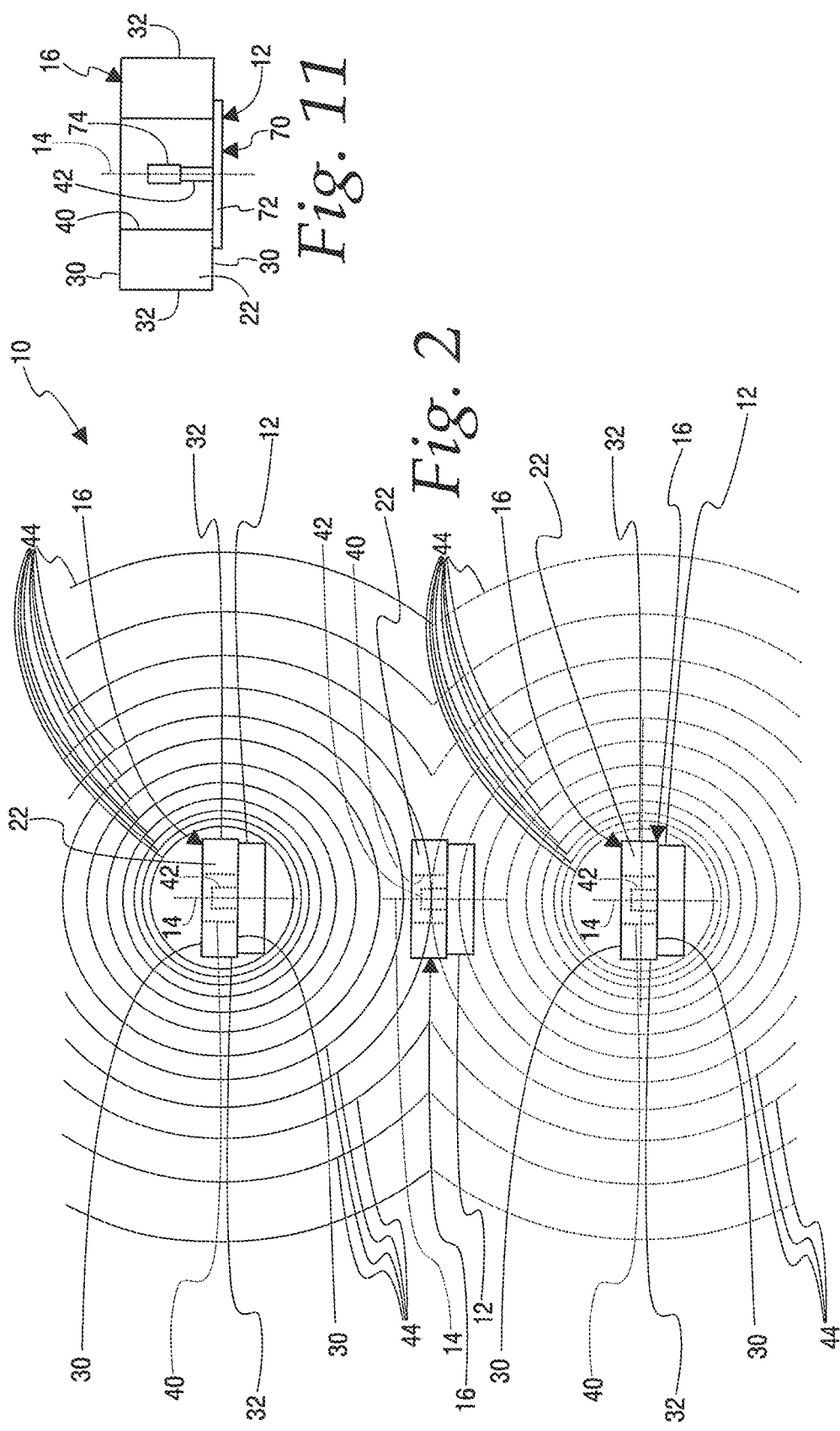

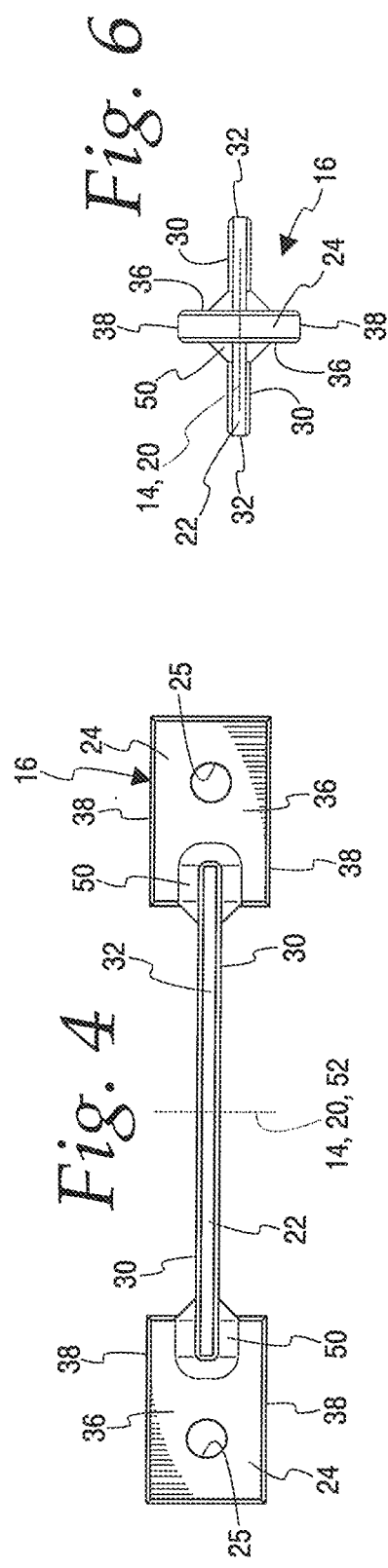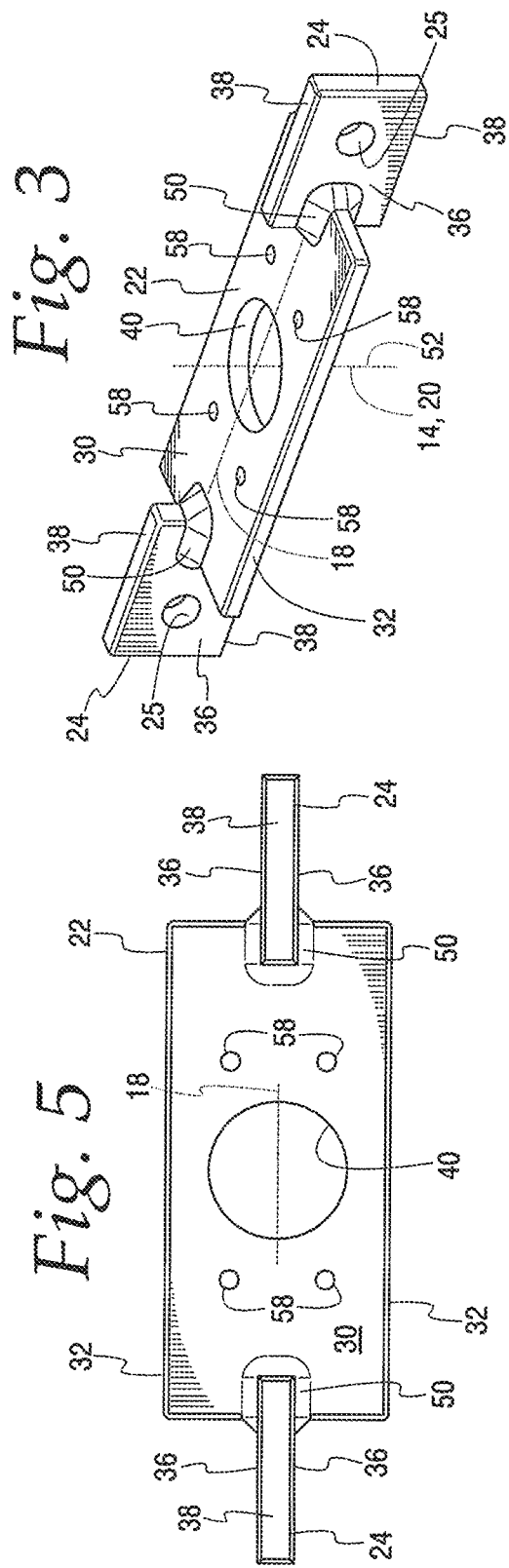

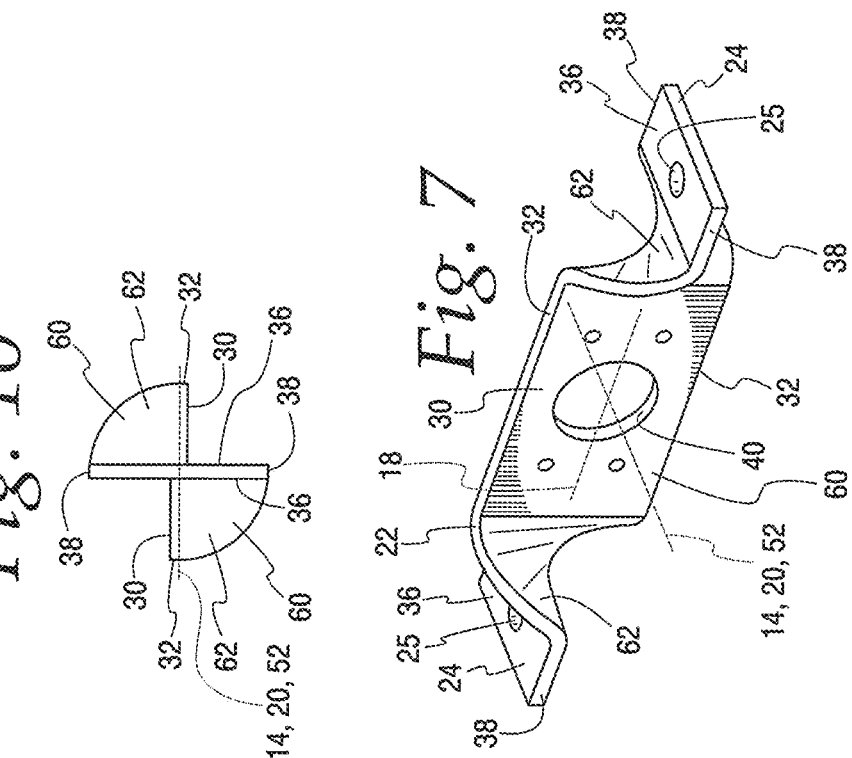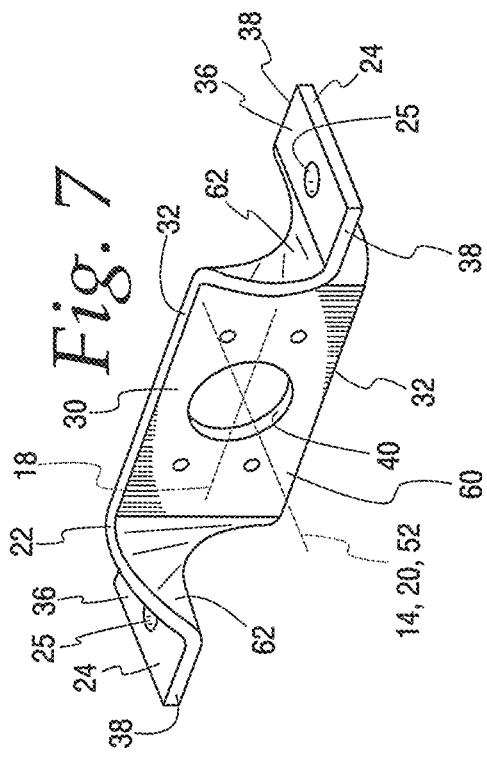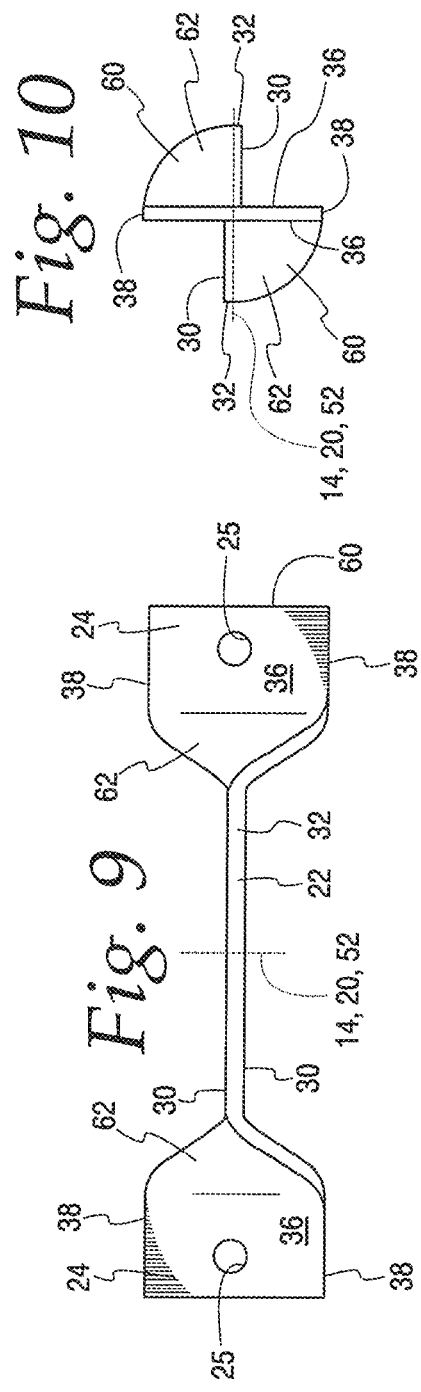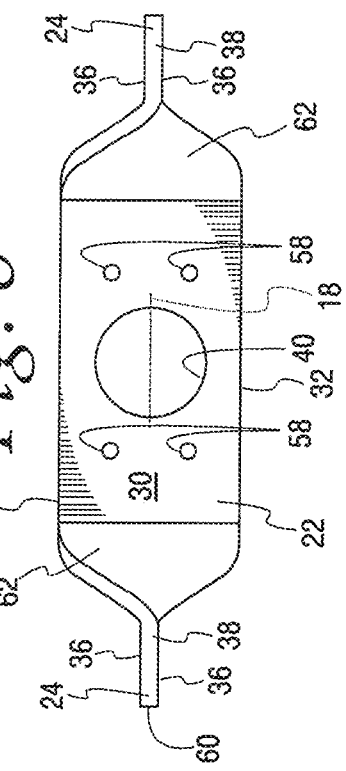

CURRENT SENSOR WITH STRAY MAGNETIC FIELD REJECTION

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

This disclosure relates to current sensors, and more particularly to systems for mounting current sensors in close proximity to each other.

BACKGROUND

Current sensors are widely used to determine the consumption of electricity and controlling devices operated with electrical current. Current sensors are also used for scientific analyses and experiments. Measuring large currents can be done by measuring the magnetic field surrounding a conductor. But these high-current sensors can be large. Often these large current sensing devices surround the conductor with a magnetic core. A step-down transformer may be used to attenuate the large signal that high-currents produce. These step-down transformers may also be used to generate an opposing magnetic field to permit the use of low-field sensors. Such step-down transformers can be expensive large and heavy. The magnetic cores and step-down transformers increase the size, weight, and cost of current measurement systems. Adjacent electrical conductors, such as bus bars, sometimes carry large currents as well. These adjacent current carrying conductors also generate magnetic fields which can interfere with the current sensor measurements. Accordingly, there is always room for improvement.

SUMMARY

In accordance with one feature of this disclosure, an electrical bus bar system is provided for mounting a plurality of current sensor devices in close proximity to each other, each of the current sensor devices having a sense axis. The system comprises a plurality of elongate bus bars extending along longitudinal axes parallel to each other. The bus bars are spaced from each other along a transverse axis that extends perpendicular to the longitudinal axes. Each bus bar has a current sensor mount portion extending between a pair of end connection portions. Each of the end connection portions is configured to connect the bus bar to an electrical conductor. Each mount portion is configured to mount one of the current sensor devices with the sense axis of the current sensor device extending parallel to the transverse axis.

As one feature, the current sensor mount portion of each bus bar includes an opening extending through a thickness of the bus bar and is configured to receive a sensor projection of the current sensor device.

In one feature, the portions of each of the bus bars comprise two tall planar surfaces joined by two short surfaces.

According to one feature, the tall planar surfaces of the current sensor mount portion of each bus bar are perpendicular to the transverse axis.

As one feature, the short surfaces of each of the portions are planar and extend parallel to each other, and the tall planar surfaces of each portion extend parallel to each other and perpendicular to the short surfaces to define a rectangular transverse cross section for the portion.

In one feature, the current sensor mount portion of each bus bar includes an opening extending through a thickness of the bus bar from one of the tall planar surfaces to the other, with the opening being configured to receive a sensor projection of the current sensor device.

According to one feature, the opening in each bus bar is a circular bore centered on a bore axis extending parallel to the transverse axis.

As one feature, the bore axis in each bus bar is perpendicular to the tall planar surfaces of the current sensor mount portion.

In one feature, the tall planar surfaces of the current sensor mount portion of each bus bar are perpendicular to the tall planar surfaces of the end connection portions of the bus bar.

According to one feature, each of the bus bars is an assembly with each of the end connection portions being separate parts that are joined to the current sensor mount portion.

As one feature, each of the bus bars is a fabrication with each of the end connection portions being fixed to the current sensor mount portion by a weld or braze joint.

In one feature, each of the bus bars is a single continuous piece of metal with the each of the end connection portions being joined to the current sensor mount portion by a 90° twist in the continuous piece of metal.

According to one feature, an electrical bus bar system is provided for mounting a plurality of current sensor devices in close proximity to each other, each of the current sensor devices having a sense axis. The system comprises a plurality of elongate bus bars extending along longitudinal axes parallel to each other. The bus bars are spaced from each other along a transverse axis that extends perpendicular to the longitudinal axes. Each bus bar has a current sensor mount portion extending between a pair of end connection portions. Each of the end connection portions is configured to connect the bus bar to an electrical conductor. The portions of each of the bus bars comprise two tall planar surfaces joined by two short surfaces. The tall planar surface of the current sensor mount portion of each bus bar is perpendicular to the transverse axis. The current sensor mount portion of each bus bar has an opening extending through a thickness of the bus bar from one of the tall planar surfaces to the other, with the opening being configured to receive a sensor projection of the current sensor device.

As one feature, the short surfaces of each of the portions are planar and extend parallel to each other, and the tall planar surfaces of each portion extend parallel to each other and perpendicular to the short surfaces to define a rectangular transverse cross section for the portion.

In one feature, the opening in each bus bar is a circular bore centered on a bore axis extending parallel to the transverse axis.

According to one feature, the tall planar surfaces of the current sensor mount portion of each bus bar are perpendicular to the tall planar surfaces of the end connection portions of the bus bar.

As one feature, each of the bus bars is an assembly with each of the end connection portions being separate parts that are joined to the current sensor mount portion.

In one feature, each of the bus bars is a fabrication with each of the end connection being fixed to the current sensor mount portion by a weld or braze joint.

According to one feature, each of the bus bars is a single continuous piece of metal with the each of the end connection portions being joined to the current sensor mount portion by a 90° twist in the continuous piece of metal.

As one feature, each mount portion is configured to mount one of the current sensor devices with the sense axis of the current sensor device extending parallel to the transverse axis.

Other features and advantages will become apparent from a review of the entire specification, including the appended claims and drawings.

BRIEF DESCRIPTION OF THE DRAWINGS

FIG. 1 is a somewhat diagrammatic plan view of an electrical bus bar system for mounting a plurality of current sensor devices in close proximity to each other according to this disclosure;

FIG. 2 is a view taken from lines 2-2 in FIG. 1 to diagrammatically illustrate the magnetic fields generated by the electric current in the two outer bus bars of FIG. 1;

FIGS. 3-6 illustrate one embodiment of a bus bar for use in the system of FIGS. 1 and 2, with FIG. 3 being an isometric view, FIG. 4 being a plan view, FIG. 5 being a side elevational view and FIG. 6 being an end view;

FIGS. 7-10 are views of another embodiment of a bus bar for use in the system of FIGS. 1 and 2, with FIG. 7 being an isometric view, FIG. 8 being a plan view, FIG. 9 being a side elevational view and FIG. 10 being an end view; and FIG. 11 is a diagrammatic illustration taken from line 11-11 in FIG. 1 and showing one embodiment of a current sensing device or system for use with the bus bar system of FIGS. 1 and 2.

DETAILED DESCRIPTION

An electric bus bar system 10 for mounting a plurality of current sensor devices 12 in close proximity to each other is illustrated in FIGS. 1 and 2. Each of the current sensor devices has a sense axis 14. The sense axis 14 is also commonly referred to as the sensitivity axis, the axis of sensitivity, or sensing axis for current sensing devices and is the axis which is highly sensitive to magnetic fields that run parallel to the axis, with the sensitivity of the current sensing device being diminished as a magnetic field becomes less parallel to the sense axis 14. For purposes of this application, the terms "sense axis", "sensitivity axis", "axis of sensitivity" and "sensing axis" are considered to have identical meanings and can be used interchangeably. Magnetic field sensors like anisotropic magnetoresistance (AMR) or Hall effect based current sensors reject the magnetic fields perpendicular to the sense axis by factors of 100 to 1000. The current sensor devices 12 may be of any suitable type of magnetic field based current sensor, such as, for example, an AMR sensor or Hall effect sensor. By way of further example, details of one type of current sensor that is highly suitable for the system 10 are shown and described in published PCT applications PCT/US2014/031807 and PCT/US2014/031792, the details of which are incorporated herein in their entirety by reference.

The system 10 includes a plurality of elongate bus bars 16 extending along longitudinal axes 18 that are parallel to each other, with the bus bars 16 being spaced from each other along a transverse axis 20 that extends perpendicular to the longitudinal axes 18. In the illustrated embodiment, a free space D between each of the bus bars 16 is in the range of 10 to 20 millimeters, but it should be appreciated that the system 10 will be useful in connection with other spacing. Each bus bar 16 has a current sensor mount portion 22 extending between a pair of end connection portions 24, with each of the end connection portions 24 being configured to connect the bus bar 16 to an electrical conductor (not shown). In this regard, each of the end portions 24 in the illustrated embodiment includes a through bore 25 for receiving a connection post, stud or bolt. Each mount portion 22 is configured to mount one of the current sensor devices 12 with the sense axis 14 of the current sensor device 12 extending parallel to the transverse axis 20 and perpendicular to the longitudinal axis 18.

In the illustrated embodiments, each of the current sensor mount portions 22 includes two tall planar surfaces 30 joined by two short planar surfaces 32, with the tall planar surfaces 30 extending parallel to each other and the short planar surfaces 22 extending perpendicular to the tall planar surfaces 30 to define a rectangular transverse cross section for the portion 22. Each of the end connection portions 24 in the illustrated embodiment are of similar configuration, with two tall planar surfaces 36 joined by two short planar surfaces 38, with the tall planar surfaces 36 of each portion 24 extending parallel to each other and perpendicular to the short surfaces 38 to define a rectangular transverse section cross section for each of the portions 24. While the planar and rectangular configurations illustrated will be desirable in many applications, it should be appreciated that other configurations for the shape/geometry of the bus bar 16 are contemplated within the scope of this disclosure. As shown by the phantom lines in FIGS. 1 and 2, each of the current sensor mount portions 22 includes an opening 40 extending through a thickness T of the bus bar 16 and configured to receive a sensor projection 42 of the corresponding current sensor device 12.

Electrical current flows through each of the bus bars 16 along the longitudinal axes 18 and generates magnetic fields, such as magnetic fields 44 illustrated diagrammatically in FIG. 2 for the two outer bus bars 16. In this regard, only the magnetic fields 44 associated with the two outer bus bars 16 are shown in FIG. 2 for purposes of illustration. As best seen in connection with the current sensor device 12 of the center bus bar 16 in FIG. 2, the system 10 mounts the current sensors 12 so that the sense axis 14 of each current sensor 12 is as perpendicular as possible to the stray magnetic field 44 generated by the adjacent bus bars 16. This is desirable because it minimizes the effects of the stray magnetic fields 44 of the adjacent bus bars 16 on the current sensor devices 12. In this regard, the sensitivity of the current sensor devices 12 to the stray magnetic fields 44 of adjacent bus bars 16 is minimized because the more perpendicular a magnetic field 44 is to the sense axis 14, the less sensitive the current sensor device 12 is to the magnetic field 44. This allows each of the current sensor devices 12 to sense the current passing through the bus bar 16 on which the current sensor 12 is mounted with the least amount of interference from the stray magnetic fields 44 generated by the adjacent bus bars 16.

As best seen in FIGS. 3-6, each bus bar 16 can be an assembly wherein each of the end connection portions 24 is a separate part that has been joined to the current sensor mount portion 22, with the illustrated embodiment being a fabrication wherein each of the end connection portions 24 is fixed to the current sensor mount portion 22 by a weld or braze joint 50. This construction is desirable in that it can maintain a very accurate alignment of the portion 22 with the end portions 24, which is important for better stray magnetic field rejection, and making the end portions 22 coplanar which is important in maintaining less stress in the bus bar 16 after bolting or otherwise connecting the end portions 22 to other devices. Furthermore, this allows for the end portions 22 to be customized for the requirements for any particular application, while maintaining the current sensor mount portion 22 and standard form.

As also seen in FIGS. 3-6, the opening 40 can be provided in the form of a circular bore 40 centered on a bore axis 52 that extends parallel to the transverse axis 20 and perpendicular to the tall planar surfaces 30 of the mount portion 22. As also best seen in FIGS. 3 and 5, the mount portion 22 can include suitable structure for releasably mounting the current sensor device 12 to the bus bar 16, such as, for example, threaded bores 58.

FIGS. 7-10 illustrate an alternate embodiment for the bus bars 16 wherein the bus bar 16 is a single continuous piece of metal 60 that has been twisted at its ends so that each of the end connection portions 24 is joined to the current sensor mount portion 22 by a 90° twist 62 in the continuous piece of metal 60.

The bus bars 16 can be made of any suitable material, and will typically be an electrically conductive metal, such as aluminum or copper.

FIG. 11 depicts a diagrammatic illustration of one of the bus bars 16 and an embodiment of one of the current sensor devices 12 in form of an in-hole current sensor system 70 such as is described in published. PCT applications PCT/US2014/031807 and PCT/US2014/031792. In FIG. 11, the bus bar 16 mounts the current sensing system 70 within the bore 40. The current sensing system 70 has one or more circuit boards 72 and the sensor projection 42. The sensor projection 42 mounts a sensor array 74. The sensor array 74 is located substantially half way between the tall planar surfaces 30 of the bus bar 16. The bore 40 is fashioned substantially in the middle of the width of the bus bar 16, and the sensor array 74 is located substantially in the middle of the bore 40. The magnetic field at the center of the bore 40 generated by the current flowing through the bus bar 16 along the longitudinal axis 18 is small enough in magnitude to allow the use of very sensitive magnetic-field sensors even for measuring large bus bar currents.

Modifications to the embodiments disclosed above are contemplated and within the scope of this disclosure. For example, while the illustrated embodiments of the bus bars 16 show the end connection portions 24 mounted so that their tall planar surfaces 36 are perpendicular to the tall planar surfaces 30 of the mount portion 22, in some applications it may be desirable for the tall planar surfaces 36 of the end connection portions 24 to be parallel with the tall planar surfaces 30 of the mount portion 22 and/or aligned with the tall planar surfaces 30 of the mount portion 22. By way of further example, while a circular bore 40 is shown in certain of the embodiments, other geometries for the bore 40 may be desirable in some applications. By way of further example, while the bore 40 has been shown as centered on the mount portion 22, other locations for the bore 40 on the mount portion 20 may be desirable in some applications. As yet another example, while rectangular geometries have been shown in all of the embodiments of the bus bars 16, other geometries may be desirable in some applications. It should be understood that the above examples are not exhaustive and that no limitations should be read into the appended claims unless expressly recited in an appended claim.

The invention claimed is:

1. An electrical bus bar system for mounting a plurality of current sensor devices in close proximity to each other, each of the current sensor devices having a sense axis, the system comprising:
a plurality of elongate bus bars that are parallel to each other, the bus bars spaced from each other along a transverse axis that extends perpendicular to the longitudinal axis of each bus bar, each bus bar having a current sensor mount portion and a pair of end connection portions, the current sensor mount portion extending between the pair of end connection portions, each of the end connection portions configured to connect each bus bar to an electrical conductor, each current sensor mount portion configured to mount one of the current sensor devices with the sense axis of the current sensor device extending parallel to the transverse axis; wherein the current sensor mount portion comprises threaded bores.

2. The system of claim 1, wherein the current sensor mount portion of each bus bar includes an opening extending through the bus bar and configured to receive a sensor projection of the current sensor device.

3. The system of claim 1, wherein each end connection portion comprises two tall planar surfaces joined by two short surfaces.

4. The system of claim 3, wherein each current sensor mount portion comprises two tall planar surfaces joined by two short surfaces, wherein the two tall planar surfaces of the current sensor mount portion of each bus bar are perpendicular to the transverse axis.

5. The system of claim 3, wherein the two short surfaces of each of the end connection portions are planar and extend parallel to each other, and the tall planar surfaces of each end connection portion extend parallel to each other and perpendicular to the two short surfaces to define a rectangular transverse cross section.

6. The system of claim 3, wherein the current sensor mount portion includes an opening extending through the bus bar from one of the tall planar surfaces to the other, with the opening being configured to receive a sensor projection of the current sensor device.

7. The system of claim 6, wherein the opening in each bus bar is a circular bore.

8. The system of claim 7 wherein the circular bore is perpendicular to the tall planar surfaces of the current sensor mount portion.

9. The system of claim 4, wherein the tall planar surfaces of the current sensor mount portion of each bus bar are perpendicular to the tall planar surfaces of each of the end connection portions of the bus bar.

10. The system of claim 9 wherein each of the bus bars is an assembly with each of the end connection portions being separate parts that are joined to the current sensor mount portion.

11. The system of claim 10 wherein each of the bus bars is a fabrication with each of the end connection portions being fixed to the current sensor mount portion by a weld or braze joint.

12. The system of claim 9 wherein each of the bus bars is a single continuous piece of metal with the each of the end connection portions being joined to the current sensor mount portion by a 90° twist in the continuous piece of metal.

13. An electrical bus bar system for mounting a plurality of current sensor devices in close proximity to each other, each of the current sensor devices having a sense axis, the system comprising:

a plurality of elongate bus bars extending along longitudinal axes parallel to each other, the bus bars spaced from each other along a transverse axis that extends perpendicular to the longitudinal axis of each bus bar, each bus bar having pair of end connection portions and a current sensor mount portion extending between the pair of end connection portions, each of the end connection portions configured to connect each bus bar to an electrical conductor, the current sensor mount portion comprising two tall planar surfaces joined by two short surfaces, the tall planar surfaces of the current sensor mount portion of each bus bar being perpendicular to the transverse axis, the current sensor mount portion of each bus bar having an opening extending through each bus bar from one of the tall planar surfaces to the other, with the opening being configured to receive a sensor projection from each current sensor device; wherein the current sensor mount portion comprises threaded bores.

14. The system of claim 13, wherein each end connection portion comprises two tall planar surface joined by two short surfaces; wherein the short surfaces of each of the end connection portions are planar and extend parallel to each other, and the tall planar surfaces of each end connection portion extend parallel to each other and perpendicular to the short surfaces to define a rectangular transverse cross section.

15. The system of claim 13, wherein the opening in each bus bar is a circular bore.

16. The system of claim 13, wherein each end connection portion comprises two tall planar surfaces joined by two short surfaces; wherein the tall planar surfaces of the current sensor mount portion of each bus bar are perpendicular to the tall planar surfaces of each of the end connection portions of the bus bar.

17. The system of claim 16 wherein each of the bus bars is an assembly with each of the end connection portions being separate parts that are joined to the current sensor mount portion.

18. The system of claim 17 wherein each of the bus bars is a fabrication with each of the end connection being fixed to the current sensor mount portion by a weld or braze joint.

19. The system of claim 16 wherein each of the bus bars is a single continuous piece of metal with the each of the end connection portions being joined to the current sensor mount portion by a 90° twist in the continuous piece of metal.

20. The system of claim 19 wherein each mount portion is configured to mount one of the current sensor devices with the sense axis of the current sensor device extending parallel to the transverse axis.

\* \* \* \* \*

UNITED STATES PATENT AND TRADEMARK OFFICE
CERTIFICATE OF CORRECTION

| | | |
|---|---|---|
| PATENT NO. | : 9,689,904 B2 | Page 1 of 1 |
| APPLICATION NO. | : 14/702975 | |
| DATED | : June 27, 2017 | |
| INVENTOR(S) | : Andy M. Peczalski and Kyle Vinnedge | |

It is certified that error appears in the above-identified patent and that said Letters Patent is hereby corrected as shown below:

In the Claims

Column 6, Line 14: "elongate" should be "elongated"

Column 6, Line 53: "claim 7" should be "claim 7,"

Column 6, Line 60: "claim 9" should be "claim 9,"

Column 6, Line 64: "claim10" should be "claim 10,"

Column 7, Line 1: "claim 9" should be "claim 9,"

Column 7, Line 9: "elongate" should be "elongated"

Column 7, Line 13: insert --a-- before the word "pair"

Column 7, Line 29: "surface" should be "surfaces"

Column 8, Line 14: "claim16" should be "claim 16,"

Column 8, Line 18: "claim17" should be "claim 17,"

Column 8, Line 19: "connection" should be "connections"

Column 8, Line 21: "claim16" should be "claim 16,"

Column 8, Line 25: "claim19" should be "claim 19,"

Signed and Sealed this
Fifth Day of December, 2017

Joseph Matal
*Performing the Functions and Duties of the
Under Secretary of Commerce for Intellectual Property and
Director of the United States Patent and Trademark Office*